United States Patent [19]
Li et al.

[11] Patent Number: 5,489,846
[45] Date of Patent: Feb. 6, 1996

[54] MAGNETIC-FIELD SENSOR WITH SPLIT-DRAIN MOSFETS

[75] Inventors: Zhijian Li; Xinyu Zheng; Litian Liu; Dongsheng Zhang, all of Beijing, China

[73] Assignee: United Microelectronics Corp., Hsinchu City, Taiwan

[21] Appl. No.: 285,578

[22] Filed: Aug. 3, 1994

[51] Int. Cl.[6] .................. G01R 33/06; H03K 17/687; H03K 17/90
[52] U.S. Cl. .................. 324/252; 324/260; 327/510; 327/581
[58] Field of Search .................. 324/244, 252, 324/260; 327/389–391, 434, 436, 437, 510, 511, 574, 581; 257/252, 421, 427

[56] References Cited

U.S. PATENT DOCUMENTS

| | | | |
|---|---|---|---|
| 4,607,271 | 8/1986 | Popovic et al. | 324/252 X |
| 4,677,380 | 6/1987 | Popovic et al. | 324/252 |
| 4,683,429 | 7/1987 | Popovic | 324/252 X |

*Primary Examiner*—Gerard R. Strecker
*Attorney, Agent, or Firm*—Townsend and Townsend and Crew

[57] ABSTRACT

A magnetic-field sensor has an array of split-drain transistors connected in parallel, each having a first, a second, and a third drain electrode, and a negative reference current generating transistor. A biasing circuit is utilized to bias the split-drain transistors in the saturated state, and to actuate the negative reference current generating transistor to generate a negative reference current. A first, a second, and a third current mirror are all controlled by a reference voltage. The second current mirror is coupled to the second drain electrode of each of the split-drain transistors to keep the reference voltage at a reference level. The first current mirror is coupled to the first drain electrode of each of the split-drain transistors to generate a first sensed current, and the third current mirror is coupled to the third drain electrode of each of the split-drain transistors to generate a second sensed current. A positive reference current generating transistor is controlled by the reference voltage to generate a positive reference current. The first and second sensed currents, and the negative and positive reference currents can be utilized to indicate the strength of the magnetic field.

6 Claims, 3 Drawing Sheets

MAGNETIC-FIELD SENSOR WITH SPLIT-DRAIN MOSFETS

BACKGROUND OF THE INVENTION

The present invention relates to a magnetic-field sensor, and more particularly to a magnetic-field sensor with split-drain metal-oxidesemiconductor field-effect-transistors (MOSFET's), which is suitable for integration on a single chip by CMOS (Complementary Metal-Oxide-Semiconductor) processing technology.

A magnetic-field-sensitive split-drain MOSFET (or named as MAGFET) is a known magnetic-field sensor using the Lorentz deflection of the channel current of the MAGFET in a magnetic field. Because of its good magnetic-field-sensitive performance and its compatibility with conventional CMOS technology, it is considered to be a promising integrated magnetic-field-sensitive component. It seems possible to use an integrated magneticfield sensor with a MAGFET as the sensitive unit instead of a traditional Hall device in order to make an integrated magnetic sensor with very small volume and with the display and measurement devices integrated together in a single chip. Such an integrated magnetic sensor can be used for measurements of direct and alternating currents as well as magnetic field strength and distribution. However, the output of prior MAGFET magnetic-field sensors has been non-linear and is difficult to digitize.

For background on MAGFET technology, refer to the following references:

1. Gallagher and W. S. Corak, "Metal-oxide-semiconductor (MOS) Hall element", *Solid-State Electron.*, 9 (1966), pp. 571–580.

2. D. Misra et al., "A novel high gain MOS magnetic field sensor", *Sensors and Actuators*, 9 (1986), pp. 213–221.

Numerical simulations for the MAGFET are discussed in the following references:

3. A. Nathan et al., "Two-dimensional numerical modeling of magnetic field sensors in CMOS technology", *IEEE Trans. Electron Devices*, ED-32 (1985), pp. 1212–1219.

4. H. P. Baltes et al., "Two-dimensional numerical analysis of a silicon magnetic field sensor", *IEEE Trans. Electron Devices*, ED-31 (1984), pp. 996–999.

5. W. Tongli and H. Yie, "Computer analysis and design optimization lo of magnetic field sensitive MOS device", *Solid-State Electron.*, 31 (1988), pp. 237–240.

SUMMARY OF THE INVENTION

The primary object of the present invention is to provide a magnetic-field sensor with split-drain MOSFET's, which can overcome the abovementioned difficulties of the prior art.

In accordance with the present invention, a sensor for a magnetic field comprises:

an array of split-drain transistors all connected in parallel, and each split-drain transistor having a first, a second, and a third drain electrode;

a first reference current generating transistor;

a biasing circuit coupled to the gate electrodes of the split-drain transistors and the first reference current generating transistor in order to bias the split-drain transistors in the saturated state, and in order to actuate the first reference current generating transistor to generate a first reference current;

a first, a second, and a third current mirror all adapted to be controlled by a reference voltage, the second current mirror being coupled to the second drain electrode of each of the split-drain transistors to keep the reference voltage at a reference level, the first current mirror being coupled to the first drain electrode of each of the split-drain transistors to generate a first sensed current, and the third current mirror being coupled to the third drain electrode of each of the split-drain transistors to generate a second sensed current; and a second reference current generating transistor with its gate electrode adapted to be controlled by the reference voltage to generate a second reference current;

whereby, the first and second sensed currents, and the first and second reference currents can be utilized to indicate the strength of the magnetic field.

In accordance with one aspect of the present invention, the first current mirror includes an array of first transistors connected in parallel, and the drain electrodes of the first transistors are connected together and to the first drain electrodes of the split-drain transistors to generate the first sensed current. The third current mirror includes an array of third transistors connected in parallel, and the drain electrodes of the third transistors are connected together and to the third drain electrodes of the split-drain transistors to generate the second sensed current. The second current mirror includes an array of second transistors connected in parallel. The drain electrodes of the second transistors are connected respectively to the second drain electrodes of the split-drain transistors, and the drain and gate electrodes of each second transistor are connected together. The reference voltage is coupled to the gate electrodes of the first, second and third transistors and the second reference current generating transistor.

In accordance with another aspect of the present invention, the biasing circuit includes a biasing PMOS transistor and a biasing NMOS transistor connected in series. The gate and drain electrodes of the biasing PMOS and NMOS transistors are connected together at a node to receive a biasing voltage, and the gate electrodes of the split-drain transistors and the first reference current generating transistor are connected to said node. In one embodiment, the first reference current generating transistor is a negative reference current generating transistor, and the second generating transistor is a positive reference current generating transistor. The split-drain transistors and the negative reference current generating transistor are all N-type MOSFET's, and the first, second, and third transistors and the positive reference current generating transistor are all P-type MOSFET's.

BRIEF DESCRIPTION OF THE DRAWINGS

The present invention can be more fully understood by reference to the following description and accompanying drawings, which form an integral part of this application.

DETAILED DESCRIPTION OF THE PREFERRED EMBODIMENTS

Figure 1:
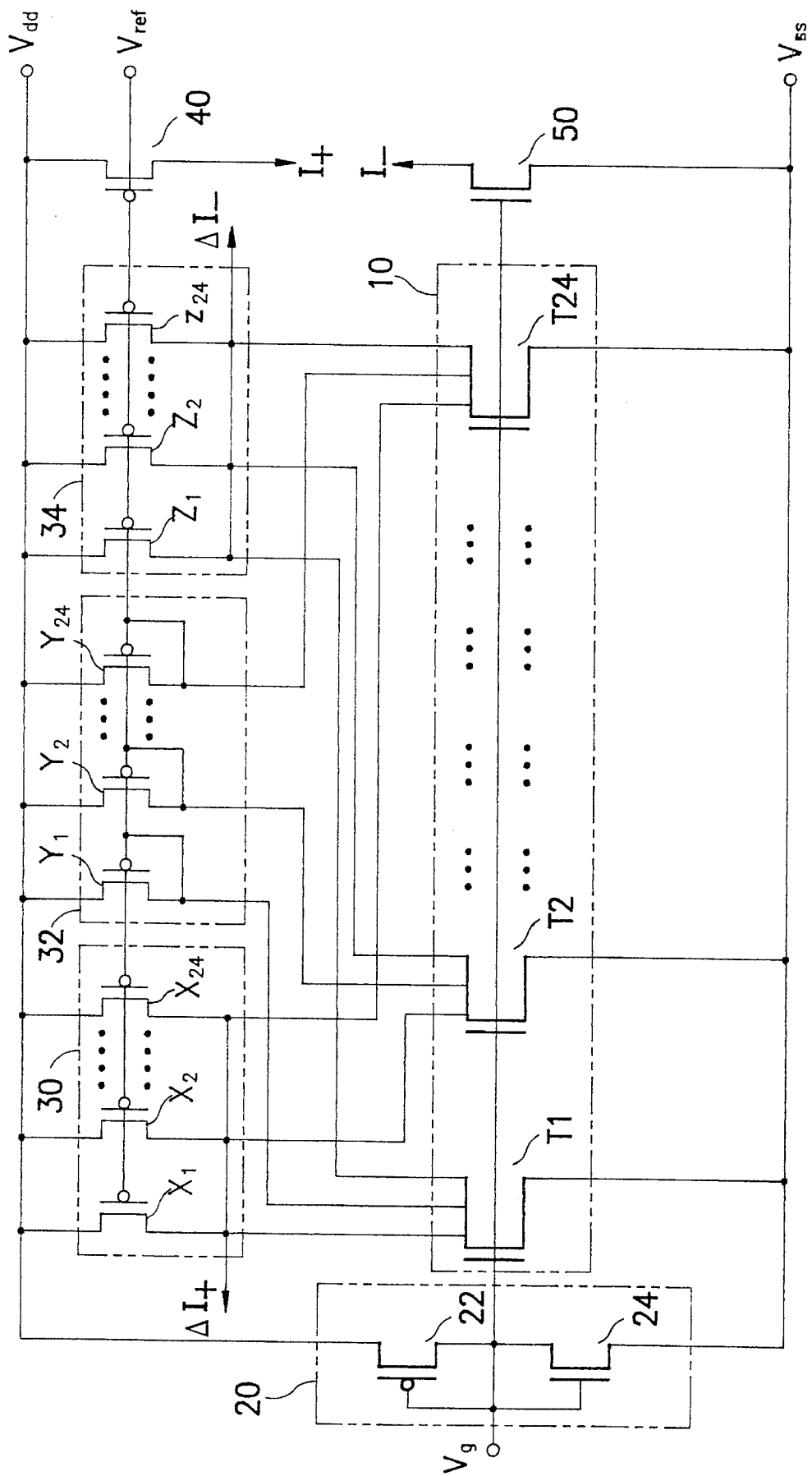
FIG. 1 is a schematic diagram of a magnetic-field sensor with an array of split-drain MOSFET's according to one preferred embodiment of the present invention.

Referring now to FIG. 1, there is shown a magnetic-field sensor circuit according to one preferred embodiment of the present invention. The magnetic-field sensor includes an array 10 of split-drain MOSFET's, a biasing circuit 20, a first 30, a second 32, and a third 34 current mirror, a positive reference current generating transistor 40, and a negative reference current generating transistor 50.

Figure 2:
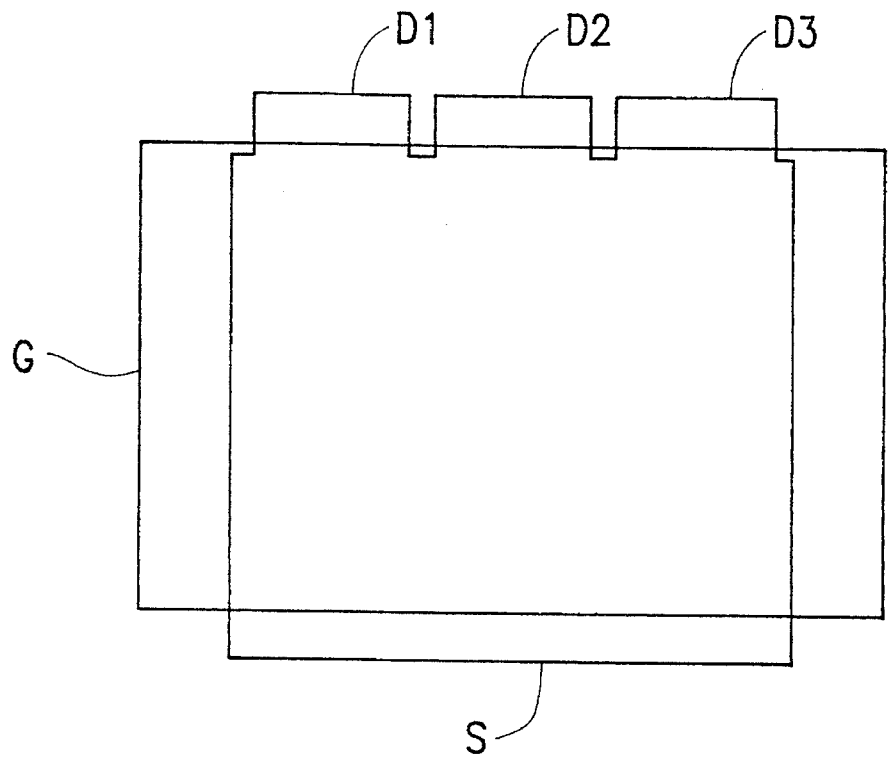
FIG. 2 is a top plan view of a split-drain MOSFET structure in a semiconductor chip, which can be used to implement the split-drain MOSFET's of FIG. 1.

In this embodiment, the split-drain MOSFET array 10 consists of 24 N-type three-split-drain transistors T1–T24 all connected in parallel. The transistors T1–T24 can be fabricated on a (100)-oriented P-type silicon substrate with 10 Ω·cm resistivity by using standard polysilicon gate MOS technology. The oxide thickness and the threshold voltage can be approximately 50 nanometers and 0.5 volt, respectively. The aspect ratio of the split-drain MOSFET's can be one with a channel length of about 90 micrometers, a channel width of about 90 micrometers, and a notch spacing between the two drains of 5 micrometers. A thus-formed three-split-drain transistor structure layout is schematically shown in FIG. 2, and includes a polysilicon gate electrode G, a source electrode S, and three split drain electrodes D1–D3.

In this embodiment, the biasing circuit 20 consists of a PMOS transistor 22 and an NMOS transistor 24 connected in series with each other. The series-connected transistors 22 and 24 are connected between the power sources $V_{dd}$ and $V_{ss}$. The gate electrodes of the transistors 22 and 24 are controlled by a biasing voltage $V_g$ which is in turn connected to the drain electrodes of the transistors 22 and 24 and the gate electrodes of the splitdrain transistors T1–T24 and the negative reference current generating transistor 50. The biasing circuit 20 is utilized to bias all of the split-drain transistors T1–T24 in the saturated state to increase the sensitivity.

In this embodiment, the first current mirror 30 consists of an array of 24 PMOS transistors X1–X24 all connected in parallel between the power source $V_{dd}$ and the split-drain MOSFET array 10. The second current mirror 32 consists of an array of 24 PMOS transistors Y1–Y24 all connected in parallel between the power source $V_{dd}$ and the split-drain MOSFET array 10. The third current mirror 34 consists of an array of 24 PMOS transistors Z1–Z24 all connected in parallel between the power source $V_{dd}$ and the split-drain MOSFET array 10. All gate electrodes of the transistors X1–X24, Y1–Y24, and Z1–Z24 are controlled by a reference voltage $V_{ref}$ which also controls the gate electrode of the positive reference current generating transistor 40.

The first drain electrodes of the split-drain transistors T1–T24 are connected to the drain electrodes of the PMOS transistors X1–X24 of the first current mirror 30. The drain electrodes of the transistors X1–X24 of the first current mirror 30 are further connected together to output a first sensed current $\Delta I_+$ which is a sum of the first drain electrode currents of the split-drain transistors T1–T24. The second, or central, drain electrodes of the split-drain transistors T1–T24 are connected to the drain electrodes of the PMOS transistors Y1–Y24 of the second current mirror 32, respectively. The gate and drain electrodes of each transistor Y1–Y24 of the second current mirror 32 are further connected together. The central drain electrode currents of the split-drain transistors T1–T24 are utilized to keep the reference voltage $V_{ref}$ at a reference level for controlling the gate electrodes of the transistors X1–X24, Y1–Y24, and Z1–Z24 of the first, second, and third current mirrors 30, 32, and 34, and the gate electrode of the positive reference current generating transistor 40. The third drain electrodes of the split-drain transistors T1–T24 are connected to the drain electrodes of the PMOS transistors Z1–Z24 of the third current mirror 34. The drain electrodes of the transistors Z1–Z24 of the third current mirror 34 are further connected together to output a second sensed current $\Delta I_-$ which is a sum of the third drain electrode currents of the split-drain transistors T1–T24. The source electrodes of the split-drain transistors T1–T24 are connected to the power source $V_{ss}$. The positive reference current generating transistor 40 is a PMOS transistor with its source electrode connected to the power source $V_{dd}$ and its gate electrode controlled by the reference voltage $V_{ref}$, and generates a positive reference current $I_+$ at its drain electrode. The negative reference current generating transistor 50 is an NMOS transistor with its source electrode connected to the power source $V_{ss}$ and its gate electrode controlled by the biasing voltage $V_g$, and generates a negative reference current $I_-$ at its drain electrode.

Figure 3:
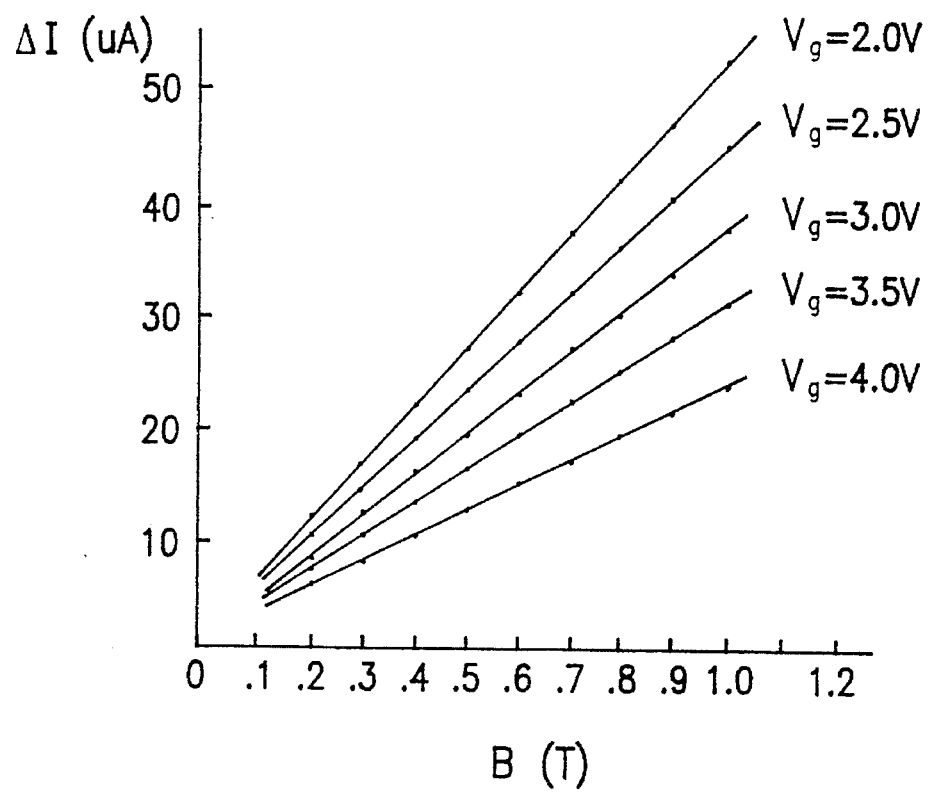
FIG. 3 is a characteristic curve diagram of the relationship between the differential current output $\Delta I$ of the magnetic-field sensor and the magnetic field B under different bias voltages.
Figure 4:
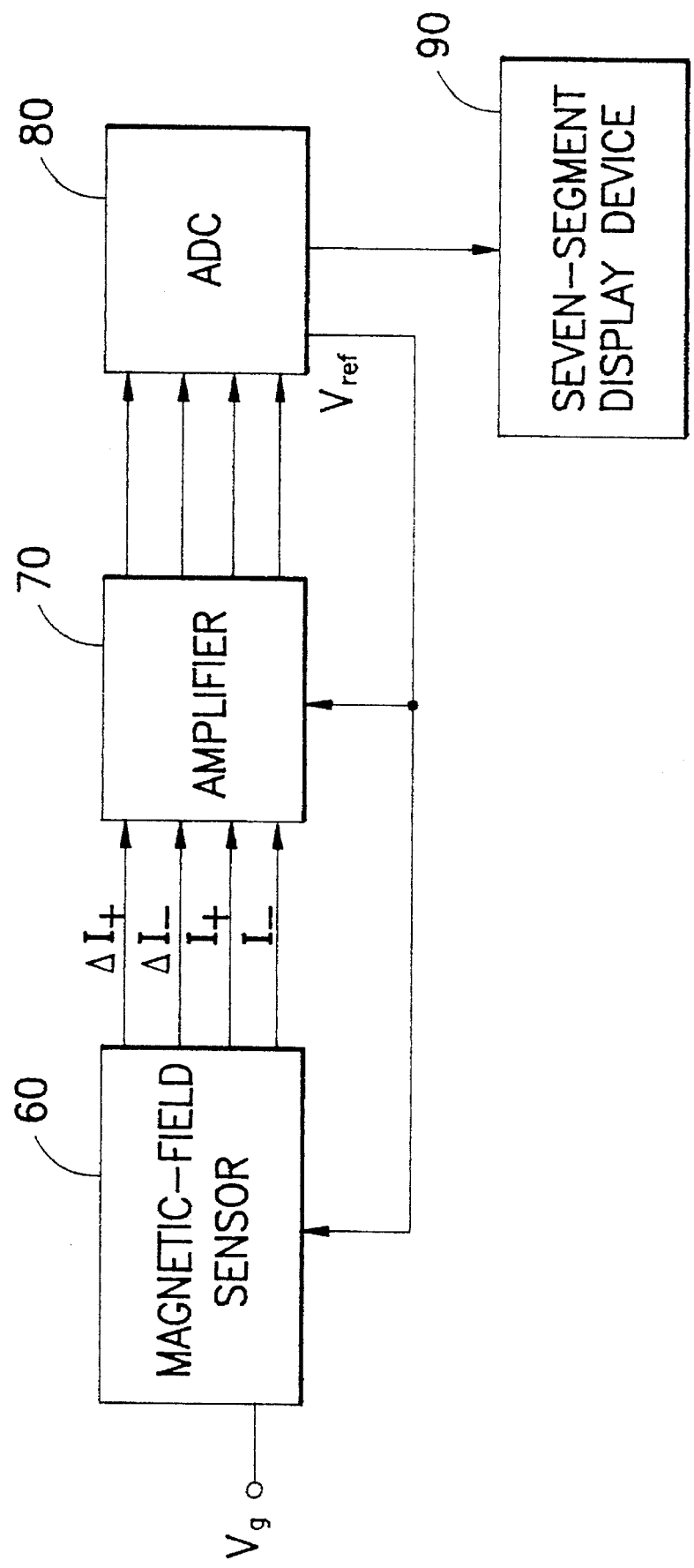
FIG. 4 is a schematic diagram of a magnetic field sensor constructed according to the present invention.

In accordance with the above-described magnetic-field sensor of the present invention, when a magnetic field is applied to the sensor, the first and second sensed currents $\Delta I_+$ and $\Delta I_-$, and the positive and negative reference currents $I_+$ and $I_-$ can be utilized to calculate the magnetic field strength. Referring to FIG. 3, there is shown a relationship between the differential current output $\Delta I$, i.e. $\Delta I_+ - \Delta I_-$, of the magnetic-field sensor of the present invention and the magnetic field B (magnetic flux density) under different biasing voltages $V_g$, e.g. −2.0 V, −2.5 V, −3.0 V, −3.5 V, and −4.0 V. For all biasing voltages, the linearity is very good. When $V_g$=−2.0 V and the magnetic field is 1 T, the differential current output $\Delta I$ can reach 50 μA. Furthermore, the ratio of $(\Delta I_+ - \Delta I_-)/(I_+ - I_-)$ is effectively the ratio of the MAGFET magnetic-field-sensitive current to the total current flowing through the MAGFET's. This ratio can be finally transferred into a digital output to indicate the magnetic field strength. FIG. 4 shows an external circuit example which can convert the outputs of the magnetic-field sensor of the present invention into digital form.

Referring to FIG. 4, the output signals $\Delta I_+$, $\Delta I_-$, $I_+$, and $I_-$ of the magnetic-field sensor 60 are coupled to an amplifier 70, and then the amplified signals are coupled to an analog-to-digital converter (ADC) 80 in order to be converted into a digital signal. A seven-segment display device 90 is coupled to the ADC 80, and displays the sensed magnetic-field strength in seven-segment digits. The amplifier 70 can be implemented by four commercially available buffer operational amplifiers ICL 7650's. The ADC 80 can be implemented by a commercially available three and a half digit double integrator circuit ICL 7107 or ICL 7106. $\Delta I_+$ and $\Delta I_-$, $I_+$ and $I_-$ provide differential signal inputs and differential reference inputs, respectively. The ADC 80 can offer the reference voltage $V_{ref}$ to the amplifier 70 and the magnetic-field sensor 60. The equation of the indicated digit D is:

$$D = A(\Delta I_+ - \Delta I_-)/(I_+ - I_-) = KS_R B$$

where A, K are constants determined by the chip and the external circuit, respectively, and $S_R$ is the relative sensitivity of the MAGFET's. In our experiments, the digital output is divided into two scales, with full scale of (1999) 0.2 T and 2 T, respectively. On the 0.2 T scale, a change of 3 to 4 Gs (Gauss) is distinguishable.

The magnetic-field sensor of the present invention, and even the external circuit can be easily integrated in a single chip by conventional CMOS technology. The biasing voltage $V_g$ of the magnetic-field sensor 60 can be designed to be adjusted outside the chip, and this capability is one of the features of the present invention because it is easier to obtain higher sensitivity with lower biasing voltage.

The magnetic-field sensor of the present invention is also characterized by the following features: (1) the MAGFET's are in the optimized equaldrain-voltage saturated state; (2) the current mode output with on-chip reference current generating devices provides a convenient digital display and self-compensation; and (3) the array form of the sensitive units increases the signal-to-noise ratio and the sensitivity.

While the invention has been described in terms of what is presently considered to be the most practical and preferred embodiments, it is to be understood that the invention need not be limited to the disclosed embodiments. On the contrary, it is intended to cover various modifications and similar arrangements included within the spirit and scope of the appended claims, the scope of which should be accorded the broadest interpretation so as to encompass all such modifications and similar structures.

What is claimed is:

1. A sensor for a magnetic field comprising:

an array of split-drain transistors responsive to a magnetic field all connected in parallel, and each split-drain transistor having a first, a second, and a third drain electrode;

a first reference current generating transistor having a gate electrode;

a biasing circuit coupled to the gate electrodes of said split-drain transistors and said gate electrode of said first reference current generating transistor in order to bias said split-drain transistors in the saturated state, and in order to actuate said first reference current generating transistor to generate a first reference current;

a first, a second, and a third current mirror, all mirrors adapted to be controlled by a reference voltage, said second current mirror being coupled to said second drain electrodes of said split-drain transistors to keep said reference voltage at a reference level, said first current mirror being coupled to said first drain electrodes of said split-drain transistors to generate a first sensed current, and said third current mirror being coupled to said third drain electrodes of said split-drain transistors to generate a second sensed current; and a second reference current generating transistor with its gate electrode adapted to be controlled by said reference voltage to generate a second reference current;

whereby, said first and second sensed currents, and said first and second reference currents, can be utilized to indicate the strength of said magnetic field.

2. The sensor as claimed in claim 1, wherein said first current mirror includes an array of first transistors connected in parallel, the drain electrodes of said first transistors being connected together and to said first drain electrodes of said split-drain transistors to generate said first sensed current; and wherein said third current mirror includes an array of third transistors connected in parallel, the drain electrodes of said third transistors being connected together and to said third drain electrodes of said split-drain transistors to generate said second sensed current.

3. The sensor as claimed in claim 2, wherein said second current mirror includes an array of second transistors connected in parallel, the drain electrodes of said second transistors being connected respectively to said second drain electrodes of said split-drain transistors, and the drain and gate electrodes of each second transistor being connected together; and wherein said reference voltage is coupled to the gate electrodes of said first, second and third transistors and said second reference current generating transistor.

4. The sensor as claimed in claim 3, wherein said biasing circuit includes a biasing PMOS transistor and a biasing NMOS transistor connected in series, the gate and drain electrodes of said biasing PMOS and NMOS transistors being connected together at a node adapted to receive a biasing voltage; and wherein the gate electrodes of said split-drain transistors and said first reference current generating transistor are connected to said node.

5. The sensor as claimed in claim 4, wherein said first reference current generating transistor is a negative reference current generating transistor, and said second generating transistor is a positive reference current generating transistor.

6. The sensor as claimed in claim 5, wherein said split-drain transistors and said negative reference current generating transistor are N-type MOSFET's, and wherein said first, second, and third transistors and said positive reference current generating transistor are P-type MOSFET's.

\* \* \* \* \*